United States Patent
Beck et al.

(10) Patent No.: US 11,362,656 B1
(45) Date of Patent: Jun. 14, 2022

(54) JOSEPHSON RF TO RF FREQUENCY CONVERTER

(71) Applicant: INTERNATIONAL BUSINESS MACHINES CORPORATION, Armonk, NY (US)

(72) Inventors: Matthew Beck, Danbury, CT (US); Daniel Joseph Friedman, Sleepy Hollow, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/513,831

(22) Filed: Oct. 28, 2021

(51) Int. Cl.
  *H03K 17/92* (2006.01)
(52) U.S. Cl.
  CPC .................. *H03K 17/92* (2013.01)
(58) Field of Classification Search
  CPC ..................................................... H03K 17/92
  USPC ........................................................ 327/528
  See application file for complete search history.

(56) References Cited

U.S. PATENT DOCUMENTS

| 4,749,888 A | 6/1988 | Sakai et al. |
| 5,334,884 A | 8/1994 | Tesche |
| 6,486,756 B2 | 11/2002 | Tarutani et al. |
| 6,922,066 B2 | 7/2005 | Hidaka |
| 9,853,645 B1 * | 12/2017 | Mukhanov ............. G06N 10/00 |

FOREIGN PATENT DOCUMENTS

| DE | 19954265 B4 | 11/2004 |
| JP | 3215021 B2 | 10/2001 |
| JP | 2009188779 A | 8/2009 |

OTHER PUBLICATIONS

Kirichenko, D.E. et al., "Zero Static Power Dissipation Biasing of RSFQ Circuits"; IEEE Transactions on Applied Superconductivity (2011); vol. 21:3, 4 pgs.

* cited by examiner

*Primary Examiner* — Tomi Skibinski
(74) *Attorney, Agent, or Firm* — Intelletek Law Group, PLLC; Gabriel Daniel, Esq.

(57) ABSTRACT

A single flux quantum (SFQ) circuit includes a radio frequency (RF) to direct current (DC) conversion stage. A DC to RF current conversion stage is coupled to a single output of the RF to DC conversion stage. The DC to RF current conversion stage includes a plurality of series stacked Josephson Junctions (JJs) having n stages, configured to convert a DC current received from the RF to DC conversion stage and reconvert the DC current to an RF tone.

20 Claims, 14 Drawing Sheets

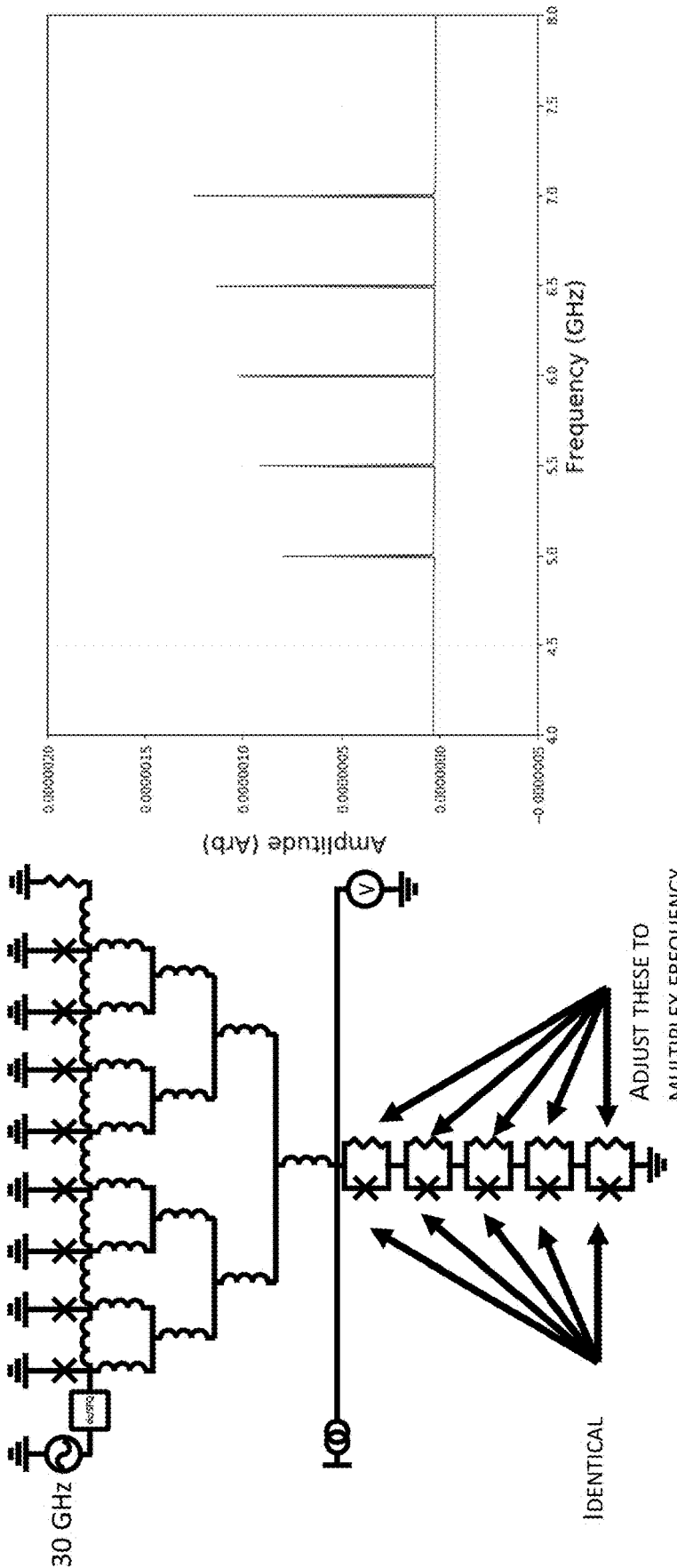

JOSEPHSON RF TO RF FREQUENCY CONVERTER

BACKGROUND

Technical Field

The present disclosure generally relates to superconducting devices, and more particularly, to frequency conversion circuits for superconducting circuit elements.

Description of the Related Art

In digital superconducting circuits, radio frequency (RF) clock distribution between connected sub circuits is a general concern, as different electrical delays to different sub circuits from a single clock source may disrupt synchronous operation. The generation of one or more additional frequencies from a provided input signal is also of general interest. A clock network can be used to deliver a clock signal to sequential elements of a system. As the distributive nature of long interconnects becomes more pronounced as design complexity and size grows, the control of arrival times of the same clock edge at different sequential elements, which are distributed over a system, becomes increasingly difficult. If not properly controlled, the clock skew, defined as the difference in the clock signal delays to sequential elements, can adversely affect the performance of the system and even cause erratic operations of the system. In the context of quantum superconducting circuits, the creation of multiple tones for use with quantum circuits is also of general interest. Such tones can be used with a device under test (DUT), for example, in support of readout operations, control operations, or as amplifier pump tones. The generation of RF tones for superconducting electronics typically involves the use of a dedicated RF generator per device, which might then be single sideband (SSB) mixed to the frequency of interest, and typically relies heavily on "commercial off the shelf" (COTS) components that are both bulky and expensive. Furthermore, these components often can only output a single RF frequency without introducing additional elements such as external mixers and/or digital to analog converters (DACs).

SUMMARY

According to one embodiment, a single flux quantum (SFQ) circuit includes a radio frequency (RF) to direct current (DC) conversion stage. A DC to RF current conversion stage is coupled to a single output of the RF to DC conversion stage. The DC to RF current conversion stage includes a plurality of series stacked Josephson Junctions (JJs) having n stages, configured to convert a DC current received from the RF to DC conversion stage and reconvert the DC current to an RF tone.

In one embodiment, the RF to DC conversion stage includes a Feeding Josephson Transmission Line (FJTL). A balanced inductive bridge is coupled between the FJTL and the DC to RF conversion stage.

In one embodiment, the RF to DC conversion stage further includes an analog RF input current source configured to provide an analog RF input signal. A converter module is coupled to an output of the RF input current source, configured to convert the analog RF input signal to discrete SFQ pulses.

In one embodiment, each Josephson Junction of the DC to RF current conversion stage includes a corresponding shunt resistor.

In one embodiment, each Josephson Junction of the DC to RF current conversion stage is configured to have a same critical current value Ic. Similarly, each corresponding shunt resistor is configured to have the same resistance value R. In one embodiment, a nominal resistance value for at least one shunt resistor of the DC to RF current conversion stage is not equal to those of the other shunt resistors of the DC to RF current conversion stage.

In one embodiment, at least one Josephson Junction of the plurality of series stacked Josephson Junctions has a critical current Ic that is different from a critical current Ic of the other Josephson Junctions of the plurality of series stacked Josephson Junctions.

In one embodiment, each Josephson Junction of the plurality of series stacked Josephson Junctions has a common critical current Ic.

In one embodiment, a spacing of a resistance of each shunt resistor is nominally equal.

In one embodiment, one or more additional plurality of series stacked Josephson Junctions are configured to convert a DC current received from the RF to DC conversion stage.

According to one embodiment, a method of frequency conversion includes receiving an analog radio frequency (RF) input current. The analog RF current is converted into discrete single flux quantum (SFQ) pulses. The SFQ pulses are provided to a feeding Josephson transmission line (FJTL). A voltage is developed across the FJTL that is equal to an RF drive frequency of the received analog RF input current times a superconducting magnetic flux quantum. A resulting current is driven from the FJTL down a balanced inductive bridge. The resulting current is received by a series stack of n Josephson Junctions. A voltage is generated across each Josephson Junction based on the resulting current. Each Josephson Junction provides a separate output tone based on the generated voltage.

In one embodiment, the driving of the resulting current down the balanced inductive bridge is until a point where a voltage across the series stack of Josephson Junctions is equal to a voltage across the FJTL.

In one embodiment, a resistance of a shunt resistor is changed while holding the critical current Ic for each Josephson Junction constant and equal to one another.

In one embodiment, a critical current Ic of at least one of the Josephson Junctions is changed with respect to the other Josephson Junctions of the series stack of n Josephson Junctions.

In one embodiment, the adjustment of the critical current for at least one of the Josephson Junctions is performed during a fabrication of the at least one Josephson Junction.

In one embodiment, at least one shunt resistor is not equal to another shunt resistor of the series stack of n Josephson Junctions.

In one embodiment, at least one Josephson Junction of the n series stacked Josephson Junctions is configured to have a different critical current Ic.

In one embodiment, each Josephson Junction of the n series stacked Josephson Junctions is configured to have a common critical current Ic.

In one embodiment, an equal delta between a resistance of each shunt resistor provides an equal delta in frequency.

According to one embodiment, a single flux quantum (SFQ) circuit includes a radio frequency (RF) to direct current (DC) conversion stage. A DC to RF current conversion stage is coupled to a single output of the RF to DC conversion stage. The DC to RF current conversion stage includes a plurality of series stacked direct current (DC) superconducting quantum interference (SQUID) units coupled to a flux bias line having n stages, configured to convert a DC current received from the RF to DC conversion stage.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 9A is an RF to RF converter circuit where the shunt resistances are adjusted, consistent with an illustrative embodiment.

FIG. 9B provides an output signal frequency spectrum for the circuit in FIG. 9A, where each Josephson Junction has a different parallel shunt resistor, consistent with an illustrative embodiment.

DETAILED DESCRIPTION

Overview

Figure 1:
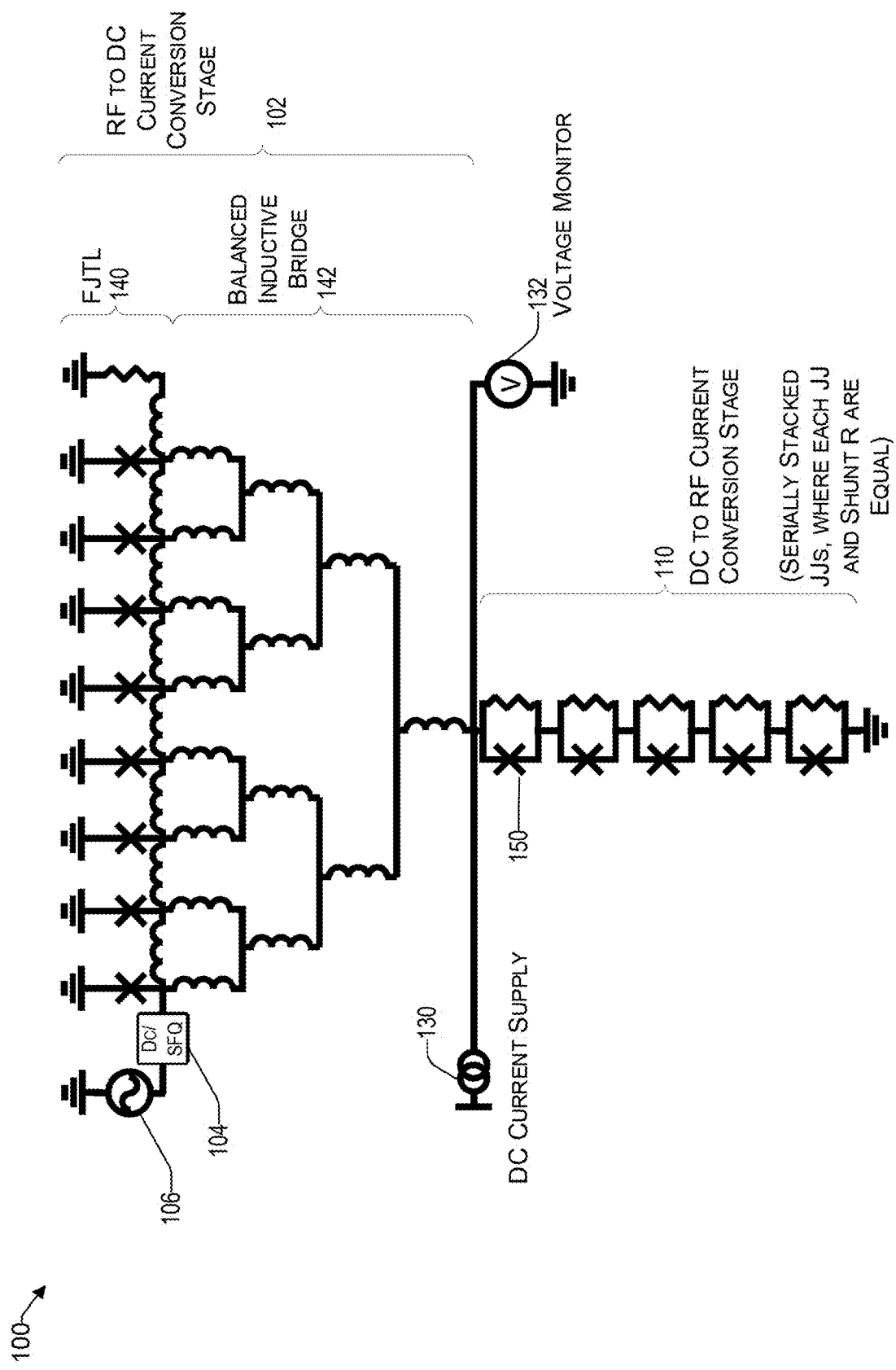
FIG. 1 is a radio frequency (RF) to RF converter circuit, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

The present disclosure generally relates to superconducting devices, and more particularly, to single flux quantum (SFQ) circuits that provide frequency conversion. In discussing the present technology, it may be helpful to describe various salient terms. As used herein a qubit represents a quantum bit and a quantum gate is an operation performed on a qubit, such as controlling the super-positioning between two qubits.

As used herein, an SFQ circuit, sometimes referred to as a rapid single flux quantum (RSFQ) circuit, is a digital electronic device that uses superconducting devices, namely Josephson Junctions, to process digital signals. As used herein, a Josephson Junction (JJ) is a quantum mechanical device that is made of two superconducting electrodes separated by a barrier. A Josephson Transmission Line (JTL) is a connector that is operative to transfer SFQ Pulses/digital information. A Feeding Josephson Transmission Line (FJTL) is an RF driven SFQ circuit operative to provide a bias voltage to drive supercurrent to its outputs.

As used herein, a driveline relates to a control line that, for example, can carry signals to the qubit.

As used herein, certain terms are used indicating what may be considered an idealized behavior, such as "lossless," "superconductor," "superconducting," "absolute zero," which are intended to cover functionality that may not be exactly ideal but is within acceptable margins for a given application. For example, a certain level of loss or tolerance may be acceptable such that the resulting materials and structures may still be referred to by these "idealized" terms.

The electromagnetic energy associated with a qubit can be stored in JJs and in the capacitive and inductive elements that are used to form the qubit. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. Alternatively, or in addition, a microwave signal (e.g., pulse) can be used to entangle one or more qubits. Much of the process is performed in a cold environment (e.g., in a cryogenic chamber), while the microwave signal reflected from the qubit is typically ultimately measured at room temperature. The amplitude and/or phase of the returned/output microwave signal carries information about the qubit state, such as whether the qubit is in its ground or excited state. The microwave signal carrying the quantum information about the qubit state is usually weak (e.g., on the order of a few microwave photons).

In one aspect, the teachings herein are based on Applicants' insight that directly applying conventional integrated circuit techniques for interacting with computing elements to superconducting quantum circuits may not be effective because of the unique challenges presented by quantum circuits that are not presented in classical computing architectures. Accordingly, embodiments of the present disclosure are further based on recognition that issues unique to quantum circuits have been taken into consideration when evaluating applicability of conventional integrated circuit techniques to building superconducting quantum circuits, and, in particular, to electing methods and architectures used for interacting efficiently with qubits. While the teachings herein are compatible with interacting with qubits, the use of the frequency combs discussed herein are also available for other applications beyond qubits and outside a cryogenic environment.

Although the terms first, second, third, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

The teachings herein provide methods and systems of producing multiple copies of phase coherent tones with degenerate frequencies that can all be clocked from a single RF source. In one embodiment, the input RF tone frequency $F_0$ is divided down to produce n output phase locked signals, each with frequency $F_0/n$. In another embodiment, the input RF tone frequency is again divided down, but instead of multiple degenerate tones outputted, a frequency comb centered around $F_0/n$ is created. In another embodiment, configurable placement of one or more tones is enabled via incorporation of DC-SQUIDs.

By virtue of the teachings herein, the wiring overhead between room temperature equipment to the low temperature stages of, for example, a dilution refrigerator, can be substantially reduced. Further, these phase-locked degenerate frequency signals can be used to greatly enhance clock distribution to circuits within the dilution refrigerator with a high-level synchronicity. Further, the ability to create non-degenerate frequency combs or multiple configurable individual frequencies from a single RF source allows the creation of readout and control tones for multiple pairs of coupled qubit-resonator pairs and/or pump tones for readout chain amplification, or could be leveraged in a range of other applications, including radio frequency circuit design. Indeed, while many of the examples are explained within the context of interaction with qubits in a cryogenic environment, uses in room temperature environment that do not immediately relate to qubits are within the scope of the present application. These concepts will be better understood in view of the example circuit diagrams discussed below.

Example Circuit Diagrams and Corresponding Waveforms

FIG. 1 illustrates an example radio frequency (RF) to RF converter circuit 100, consistent with an illustrative embodiment. More specifically, the converter circuit 100 can be a single flux quantum (SFQ) circuit that may include an RF to DC current conversion stage 102. The RF to DC current conversion stage 102 can be operative to generate a direct current (DC) voltage based on SFQ pulses received from the DC/SFQ module 104. For example, the DC/SFQ module 104 receives an analog RF input current from the analog RF input current source 106 and converts it to discrete SFQ pulses with pulse to pulse spacing equal to the inverse of the frequency of the RF input current. The RF stage may include a feeding JTL (FJTL) stage 140 that can be connected to a balanced inductive bridge 142. A plurality of Josephson Junctions (JJs) 110 having n stages, with shunt resistors, may be connected to the balanced inductive bridge 142. In one embodiment, the values for each JJ and shunt resistance (e.g., resistor) pair are nominally equal.

Accordingly, in the example of FIG. 1, the RF current to DC current conversion stage 102 receives an (e.g., analog current) RF input signal from the current source 106 and converts this signal to discrete SFQ pulses by way of the DC/SFQ module 104. These SFQ pulses are provided to the FJTL 140, which develops a voltage across the FJTL 140 that can be substantially equal to the RF drive frequency of the analog RF input current times the superconducting magnetic flux quantum. This voltage then begins to drive current down the balanced inductive bridge 142 and into the stack of serially connected JJs 110.

The FJTL 140 drives current down into the series stacked JJs 110 up until a point when the voltage across the entire series JJ stack 110 is substantially equal to the voltage across the FJTL 140, referred to herein as the steady operating state of the converter circuit 100. The Balanced inductive bridge 142 can be constructed of superconducting wire that can carry DC current with no voltage drop. By way of example only, and not by way of limitation, consider the stack of JJs 110 to comprise a single JJ and shunt resistor pair, such as 150 (i.e., n=1). That single JJ and shunt resistor pair (e.g., 150) is forced to drop the entirety of the voltage 132 across it and then oscillate at the same frequency as what was applied by the analog RF input current source 106, thereby acting like a frequency repeater. With n=2 or more JJs in the stack 110 (i.e., JJ and shunt resistor pairs, each having a substantially equal critical current and a parallel shunt resistor), the voltage across each JJ would then be substantially equal to the FJTL voltage divided by n. Accordingly, each JJ would oscillate at the input RF signal frequency divided by the number of JJs in the stack, thereby providing frequency division of the original input RF tone (106) by a factor n. For example, for two JJs in the stack 110 (i.e., n=2), the input RF frequency is divided by 2 and the entire structure 100 can provide a max fanout (i.e., ratio of input to output signals) of 2. Similarly, for three JJs in the stack 110 (i.e., n=3), the division and max fanout of the input frequency is three. Thus, for n JJs in the stack 110, the division of the input frequency and maximum fanout is n.

In the example embodiment of FIG. 1, the feeding Josephson Transmission Line (FJTL) 140 can be driven with a single RF source 106 and loaded with a series of n=5 identical series stacked JJs 110, each JJ having equal Ic and equal shunt resistance. The RF drive (i.e., analog RF input current source 106) creates a DC voltage across the FJTL 140 as provided by equation 1 below:

$$V = \Phi_0 \times F_0 \quad \text{(Eq. 1)}$$

Where:
V is the voltage across the FJTL 140;
$\Phi_0$ is the superconducting magnetic flux quantum; and
$F_0$ is RF drive frequency from the analog RF input current source 106.

As mentioned above, this voltage V then can drive current down to the stacked JJs (i.e., represented by crosses in 110) exceeding their respective critical currents and push them into the voltage state. Accordingly, this voltage can drive current down the inductive ladder into the linear chain of JJs exceeding each of their ideally matched critical currents. The current can be further pushed into the chain until the voltage of the FJTL is balanced by the JJ chain, where the voltage across each JJ is V/n, where n is the number of JJs in the chain. At steady state, each junction phase evolves at a rate provided by equation 2 below:

$$F_j = \frac{F_0}{n} \quad \text{(Eq. 2)}$$

Where n is the number of JJs in the stack.

The DC voltage across each junction, by way of the second Josephson relation, then can force each of the JJ phases to evolve at a rate provided by equation 3 below:

$$\phi(t) = 2\pi * \frac{V * t}{n \Phi_0} = 2\pi * F_j * t \quad \text{(Eq. 3)}$$

Where:

$$F_j = \frac{V}{n \Phi_0},$$

and
V is the FTJL voltage
If all the JJs are equal, phi(t) is the phase of each JJ. For disparate JJs in the stack, there would be n different phi(t) equations, each on with a different Fj.

Figure 2A:
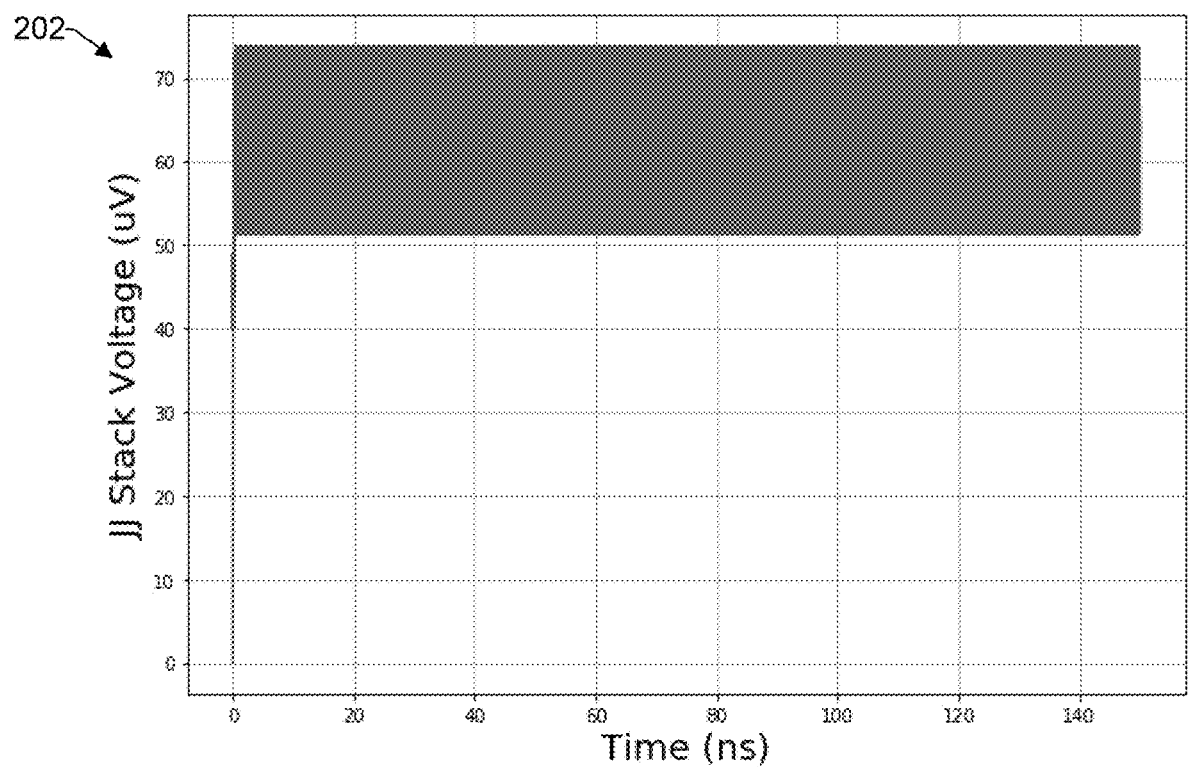
FIG. 2A is a plot of a voltage across the Josephson Junction stack of FIG. 1, consistent with an illustrative embodiment.
Figure 2B:
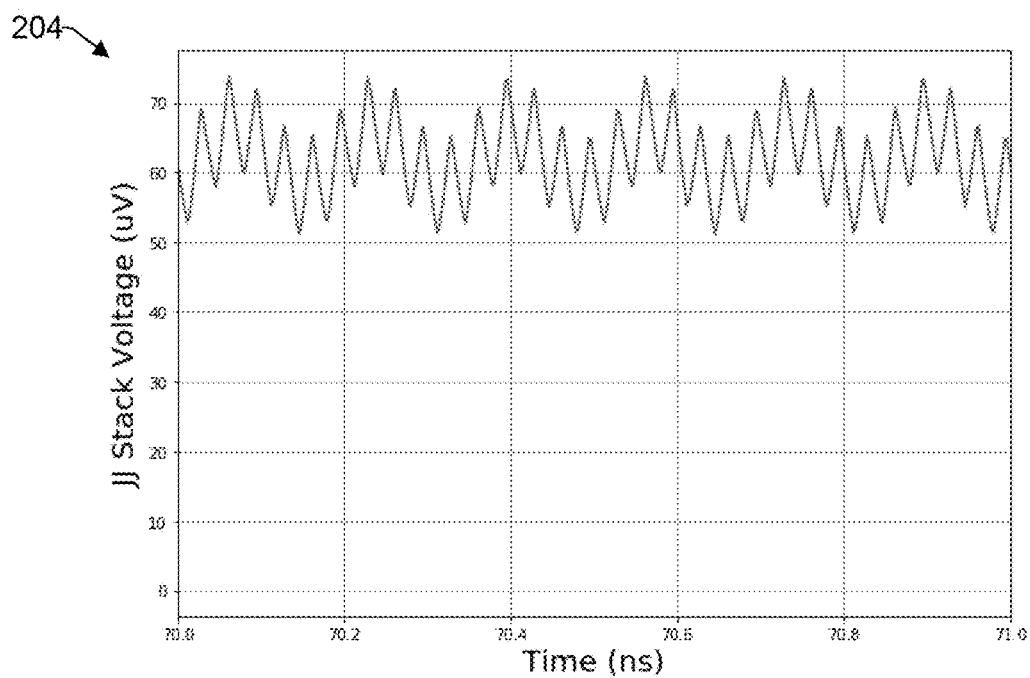
FIG. 2B is a plot of a voltage across the Josephson Junction stack of FIG. 1 over 1 ns, consistent with an illustrative embodiment.

Reference now is made to FIGS. 2A and 2B, which collectively show a dynamic simulation of the circuit in FIG. 1, consistent with an illustrative embodiment. For example, a drive tone of 30 GHz is applied by the current source 106 to the FJTL 140 via the DC/SFQ converter 104. FIG. 2A illustrates a resulting plot 202 of the voltage across the JJ stack 110 as would be observed at the monitor 132. In this example, the average DC voltage across the entire stack 110 is $V = \Phi_0 \times F_0 = 2.067 \times 10^{-15} \times (30 \times 10^9) \approx 62$ µV. FIG. 2B illustrates the output waveform over 1 ns. The 30 GHz drive tone can be seen along with a smaller frequency carrier wave. This carrier wave is at the divided down signal of frequency $$F_j = \frac{F_0}{n} = 6 \text{ GHz},$$

Figure 3:
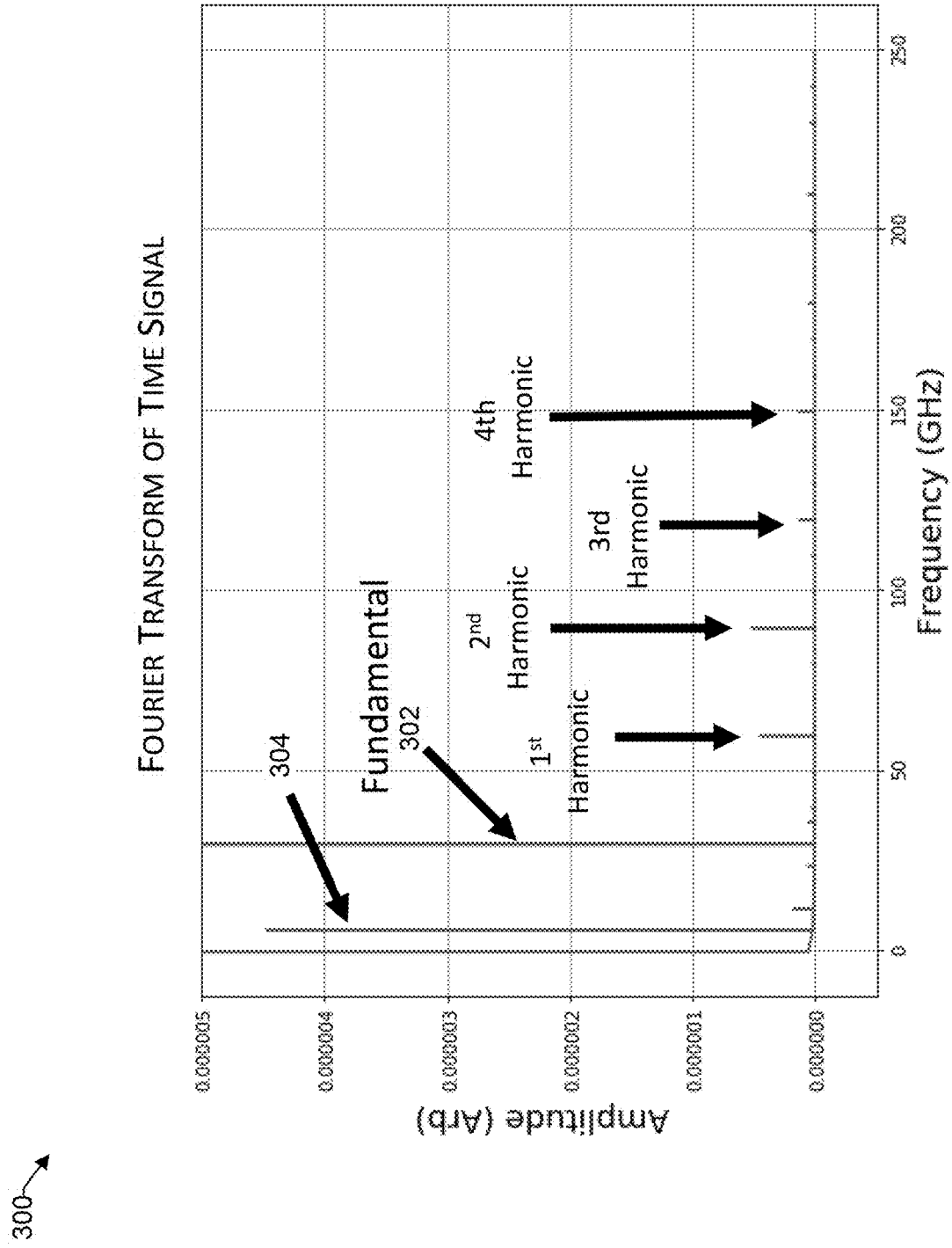
FIG. 3 is a plot of a Fourier transform of a time domain trace of the circuit of FIG. 1, consistent with an illustrative embodiment.

FIG. 3 is a plot of a Fourier transform of a time domain trace of the circuit of FIG. 1, consistent with an illustrative embodiment. More, the plot 300 shown in FIG. 3 specifically shows the results of applying a Fourier transform to the steady state signal observable at monitor 132 and shown in time domain form in FIG. 2A. FIG. 3 illustrates the presence of 30 GHz drive frequency content 302 along with a multitude of its harmonics in the spectrum. The second peak 304 is observed to be significantly lower in frequency than the 30 GHz drive tone and will be discussed in the context of FIG. 4 below.

Figure 4:
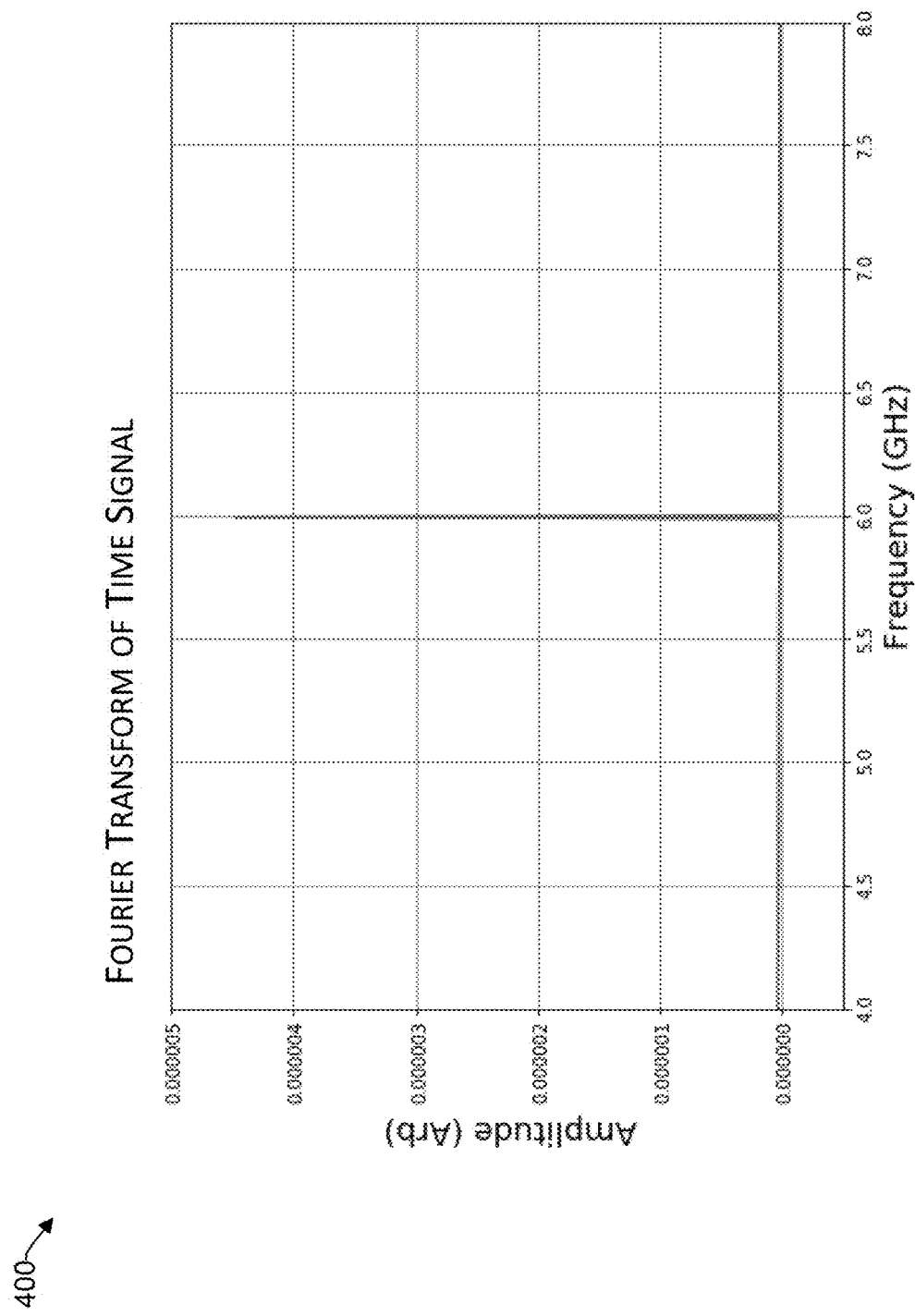
FIG. 4 is a plot of the Fourier transform of FIG. 3 that is zoomed in at a center of 6 GHz, consistent with an illustrative embodiment.

FIG. 4 is a plot of the Fourier transform of FIG. 3 that is zoomed in at a center frequency of $$F_j = \frac{F_0}{n} = \frac{30 \text{ GHz}}{5} = 6 \text{ GHz},$$

consistent with an illustrative embodiment. Plot 400 demonstrates that the 30 GHz drive tone can be successfully divided down to a 6 GHz signal by the five series stacked JJs. The signal shown in plot 400 corresponds to the second peak 304 of FIG. 3.

Figure 5:
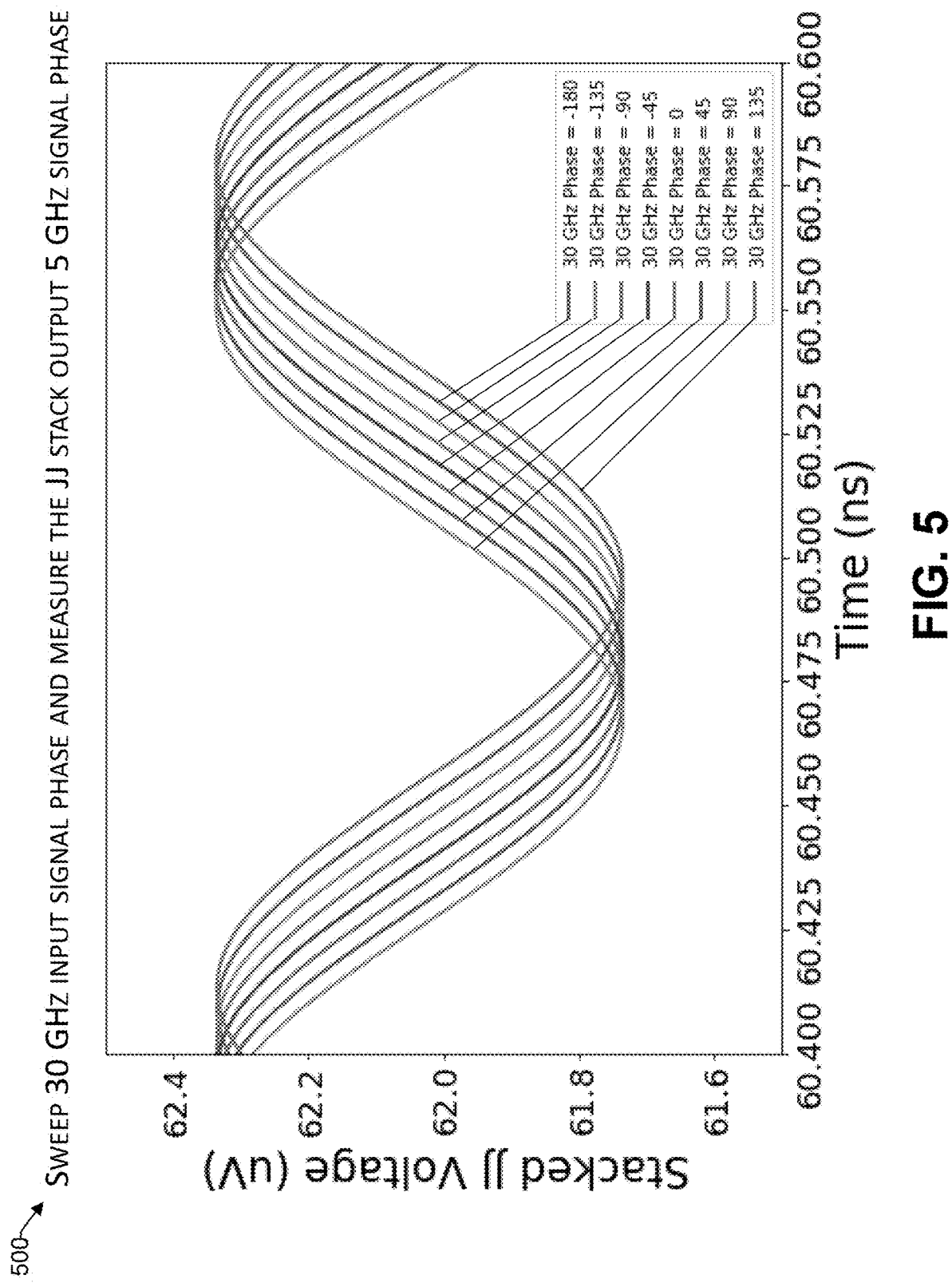
FIG. 5 is a plot of a simulated Josephson Junction stack output voltage as a function of a 30 GHz drive tone phase, consistent with an illustrative embodiment.

Reference now is made to FIG. 5, which is a plot 500 of a simulated Josephson Junction (JJ) stack output voltage as a function of a 30 GHz drive tone phase. Plot 500 shows the entire JJ stack voltage observed at monitor 132 but for different 30 GHz drive phases. Plot 500 demonstrates that as the phase of the 30 GHz tone is varied, the phase of the output 6 GHz tone tracks with it, albeit at a reduced rate.

Figure 6:
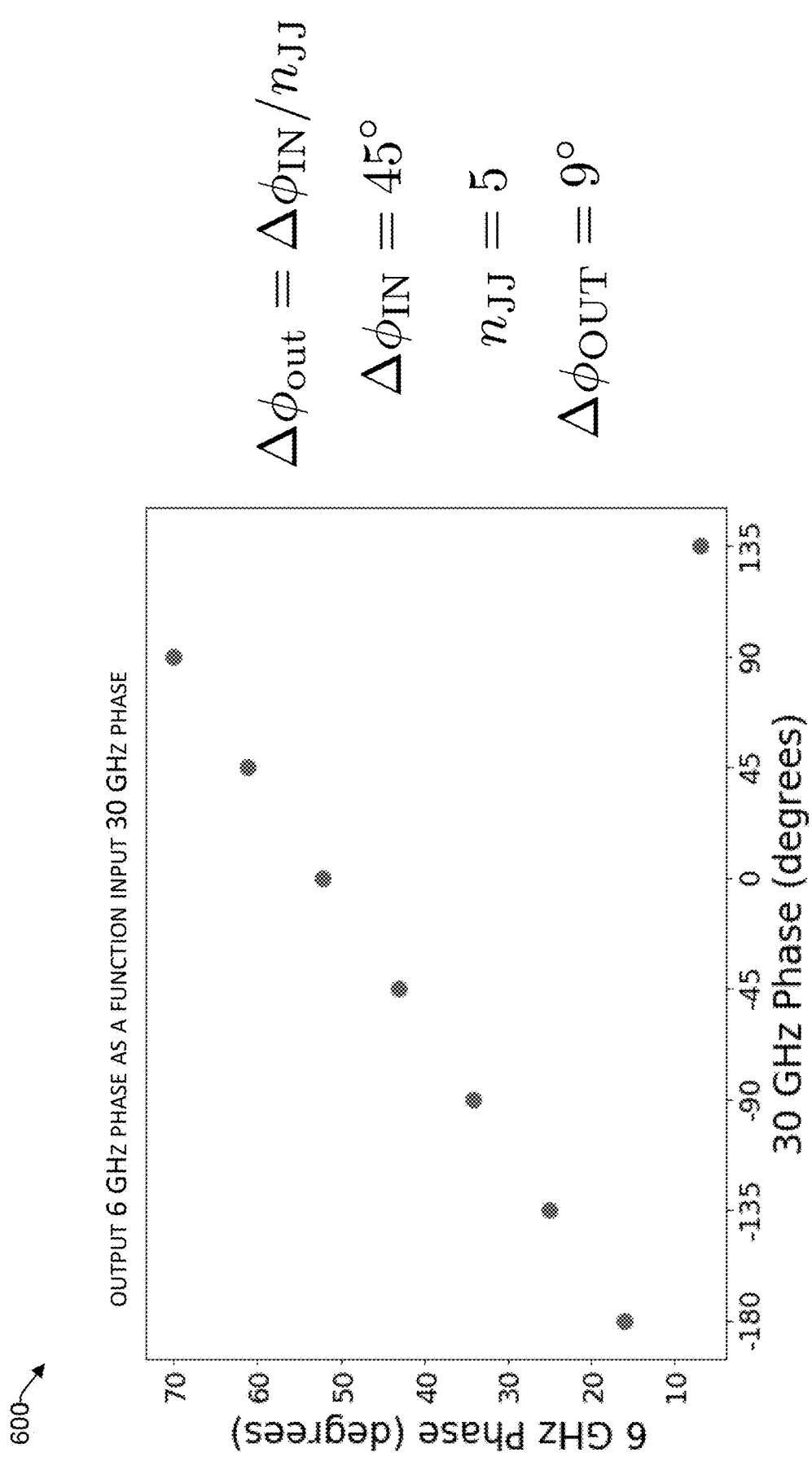
FIG. 6 is a plot of a 6 GHz output tone phase as a function of the 30 GHz input tone phase, consistent with an illustrative embodiment.

FIG. 6 is a plot 600 of a 6 GHz output tone phase as a function of the 30 GHz input tone phase, consistent with an illustrative embodiment. For example, input drive tone phase steps of 45 degrees (with respect to the input signal) are applied, resulting in output tone phase steps of 9 degrees (with respect to the output signal). The division in the delta phase from input to output tone means that multiple substantially phase stable tones can be generated from a single RF source (e.g., 106 in FIG. 1).

By way of example and not by way of limitation, a JJ stack comprising identical JJs and shunt resistors can have the ability to provide a multitude of phase coherent RF clock signals to sync disparate or physically distant subcircuits in a large macro. Moreover, whatever phase instability δϕ of the clock tone, it can be divided down such that each of the n output tones phases shift δϕ/n.

Figure 7A:
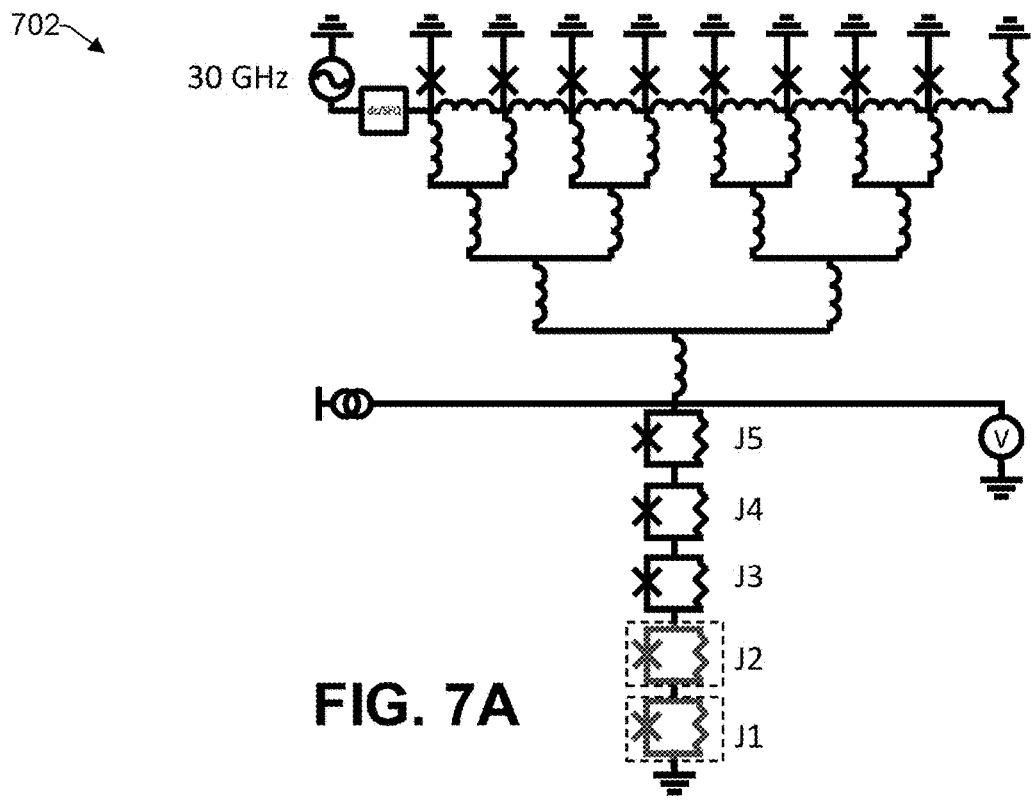
FIG. 7A is an RF to RF converter circuit, consistent with illustrative embodiment.
Figure 7B:
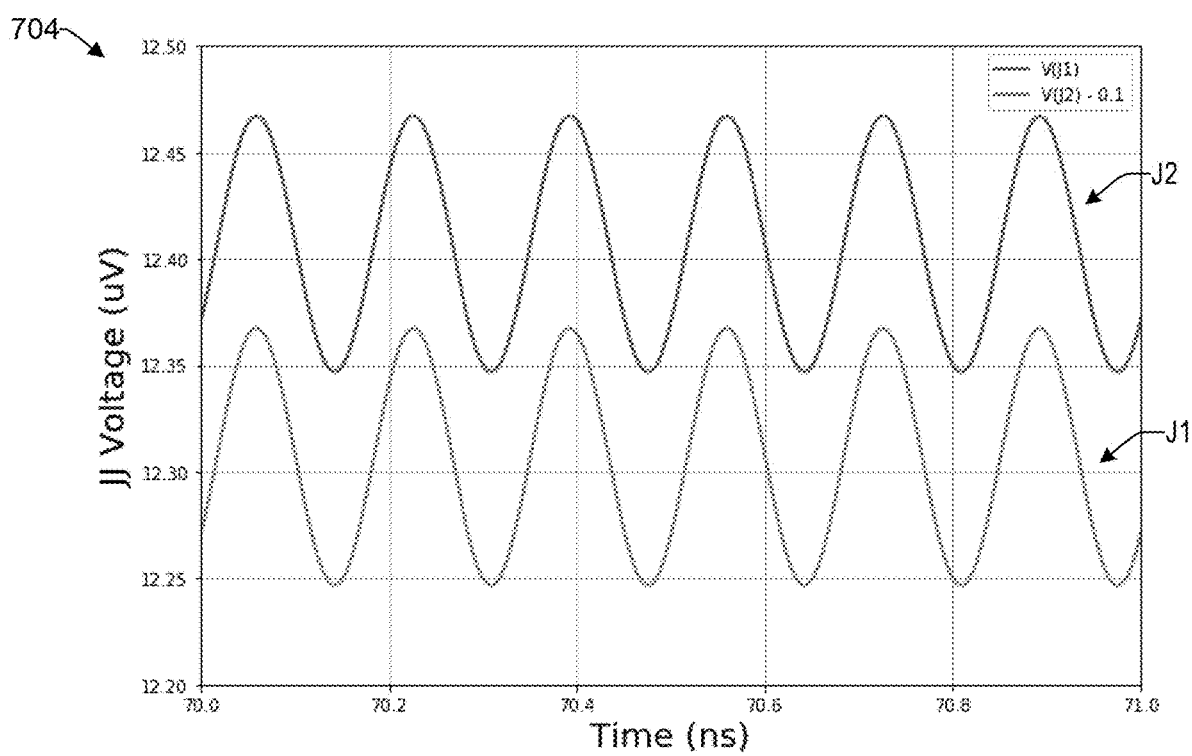
FIG. 7B provides simulation results of a voltage across two of the Josephson Junctions in a stack of five Josephson Junctions, consistent with illustrative embodiments, respectively.

FIGS. 7A and 7B illustrate an RF to RF converter circuit 702 and differential voltage simulated across two of the Josephson Junctions in a stack of five Josephson Junctions, respectively, consistent with illustrative embodiments. More specifically, FIG. 7B illustrates a differential voltage simulated across Josephson Junctions J2 and J1 of FIG. 7A, respectively. Plot 704 demonstrates that the voltage waveforms have the same amplitude and are in phase with one another. For clarity, the waveforms of J1 and J2 are offset in the Y axis. Accordingly, the signal appearing across each JJ in the series stacked JJs can be used as a clock for different subcircuits in a larger SFQ circuit, with each clock phase locked to one another.

Figure 8:
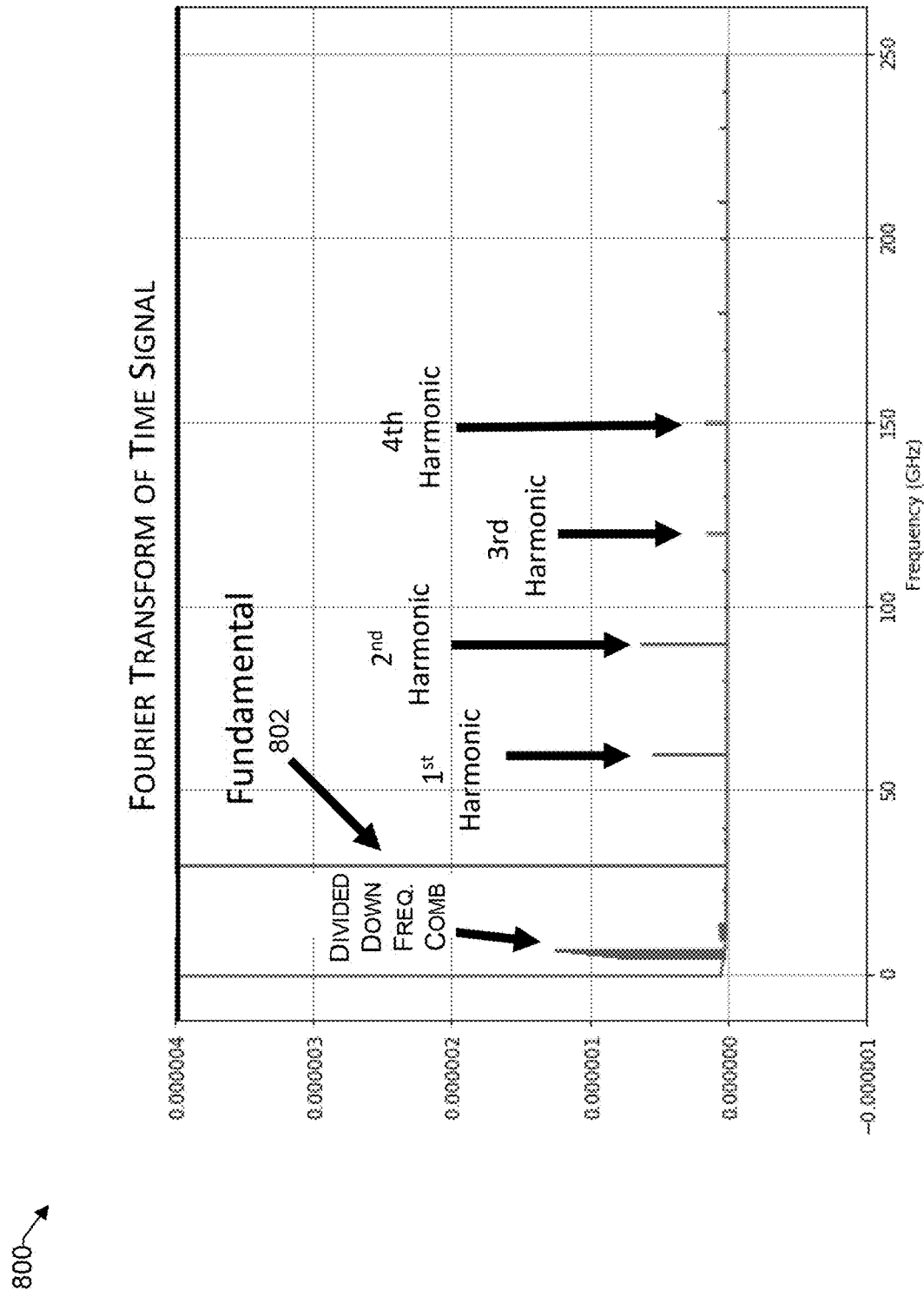
FIG. 8 provides a plot of a Fourier transform of a time domain trace of the circuit of FIG. 1, consistent with an illustrative embodiment.

Referring back to FIG. 1, in another embodiment, the IcR product of the JJs in the stack 110 are adjusted such that each JJ has a different characteristic voltage. One way this adjustment can be achieved is by changing the individual shunt resistance for each JJ while holding the Ic for each JJ constant and substantially equal. Adjusting the IcR product of any of the JJs in the stack 110 can have the effect of adjusting the steady state voltage developed across it, thereby changing its output frequency. In this regard, FIG. 8 provides a plot of a Fourier transform of a time domain trace of the circuit of FIG. 1, consistent with an illustrative embodiment. FIG. 8 illustrates a 30 GHz drive (i.e., fundamental) frequency content 802 along with a multitude of its harmonics in the spectrum. The spectral content at 6 GHz in the case of the matched JJs and Rs is now spread across 5 tones centered at 6 GHz in the case of unmatched JJs and Rs. FIG. 8 is a comparative plot to FIG. 3, where instead of incorporating all degenerate JJs and resistors in the stack, disparate resisters and degenerate JJs are used. FIG. 8 demonstrates that the wide band spectrum is similar to that in FIG. 3, but instead of a single tone seen below the 30 GHz drive tone, a multitude of tones are manifest. Further detail regarding this and related cases is presented in FIG. 9 and the associated discussion below.

In one aspect, for a JJ stack comprising the same JJs and shunt resistors, the design can be robust against fabrication spread in both the JJs and the resistors. A global increase in Ic (e.g., set by the oxidation parameters) of each junction may only adjust the amplitude of the output tones but not the designed frequency. Should the resistor fabrication step falter and the ohms/SQ change, the voltage across each JJ, and hence the user designed JJ output frequency, would not change as the ratio of that JJs resistor to the total series resistance would not change as each resistor would adjust proportionately.

Reference now is made to FIG. 9A, which illustrates an RF to RF converter circuit where the shunt resistances are adjusted, consistent with an illustrative embodiment. In contrast to the embodiment of FIG. 1, where each of the Josephson Junction and shunt resistor pairs of the stack are the same, in FIG. 9A, each of the shunt resistance elements 910 is adjustable to provide a desired center frequency. In this regard, FIG. 9B provides an output signal frequency spectrum again for the circuit in FIG. 9A, where each JJ has can have a different valued shunt resistance across it (in this case with substantially equal delta-R values between subsequent shunt resistors). The number of tones in FIG. 9B is set by the number of stacked JJs. By slightly offsetting the characteristic voltage for each of the 5 JJs of FIG. 9A, the fundamental drive frequency can be divided. As explained previously, if the Rs were all substantially equal, the fundamental would be divided by simply the number of JJs (i.e. 30/5=6 GHz). The number of JJs in FIG. 9A sets center of band. The delta values for the JJ shunt Rs can set the delta in frequency.

Figures 10A, 10B:
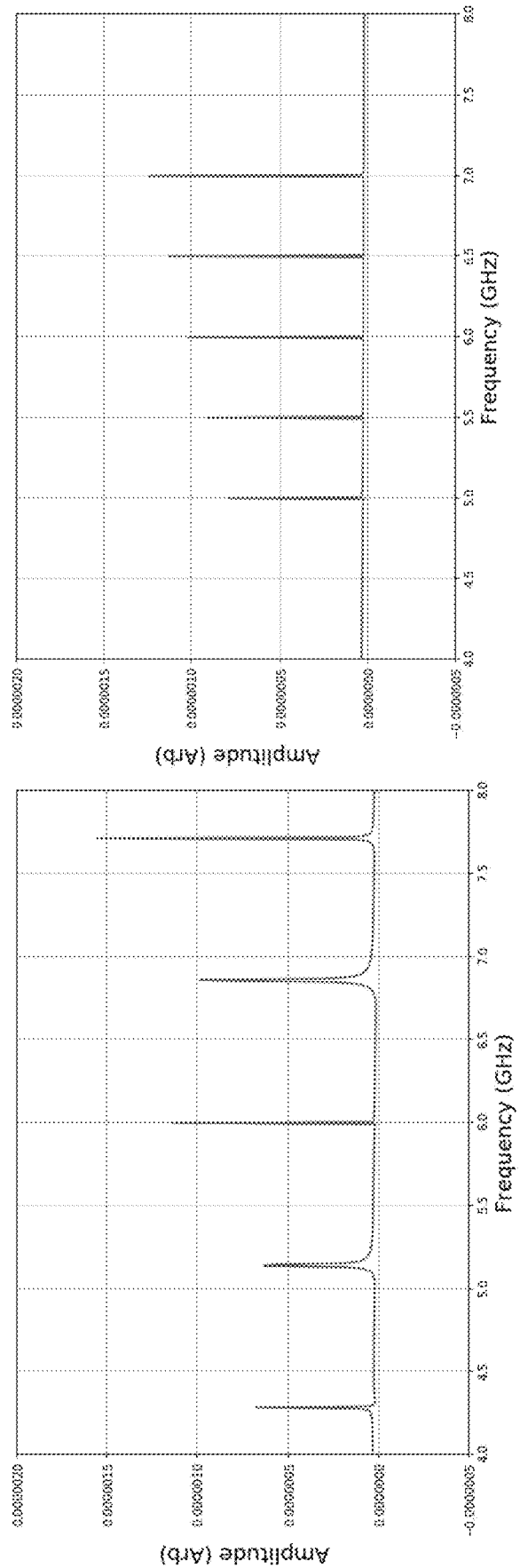
FIG. 10A is a plot of the output spectrum from stacked Josephson Junctions, where the shunt resistors have a first delta resistance between each shunt resistor, consistent with an illustrative embodiment.
FIG. 10B is a plot of the output spectrum from stacked Josephson Junctions, where the shunt resistors have a delta resistance between each shunt resistor that is different from that of FIG. 10A, consistent with an illustrative embodiment.

FIG. 10A is a plot of the output spectrum from stacked JJs where the shunt resistors have a first delta resistance between each shunt resistor, consistent with an illustrative embodiment. In the example of FIG. 10A, the resistance of the shunt resistor for each JJ of the series stack of FIG. 9A is 1.0, 1.2, 1.4, 1.6, 1.8 ohms, respectively. By way of contrast, FIG. 10B is a plot of output spectrum from a stacked JJs where the shunt resistors have a delta resistance between each shunt resistor that is different from that used to generate the results shown in FIG. 10A, consistent with an illustrative embodiment. More specifically, in the example of FIG. 10B the resistance of the shunt resistor for each JJ of the series stack of FIG. 9A is 1.0, 1.1, 1.2, 1.3, and 1.4 ohms, respectively. An equal delta R results in an equal delta F. In this regard, one can use plot of FIG. 10B to directly calculate what frequencies will be emitted from the stacked JJs. The DC voltage that the entire stack will maintain is provided by the expression below:

$$V_S = \Phi_0 F_0 \quad \text{(Eq. 4)}$$

Accordingly, the current flowing through the stack can be provided by the expression below:

$$I_s = \frac{V_S}{\sum R_i} \quad \text{(Eq. 5)}$$

Where the sum is taken over all the shunt resistors in the stack.

The voltage across the ith JJ in the stack is then $V_i = I_s R_i$. Finally, the frequency that the ith JJ emits can be provided by the equation below:

$$F_i = V_i/\Phi_0 = F_0 \times R_i/\sum R_i \quad \text{(Eq. 6)}$$

Accordingly, the ratio of the ith shunt resistor to the total resistance of the stack can be the factor by which the drive frequency is reduced. In the example of FIG. 10B, with stack resistance of [1.0, 1.1, 1.2, 1.3, 1.4] Ohms, one can calculate that the frequency comb will have components at [5.0, 5.5, 6.0, 6.5, 7.0] GHz.

Figure 11A:
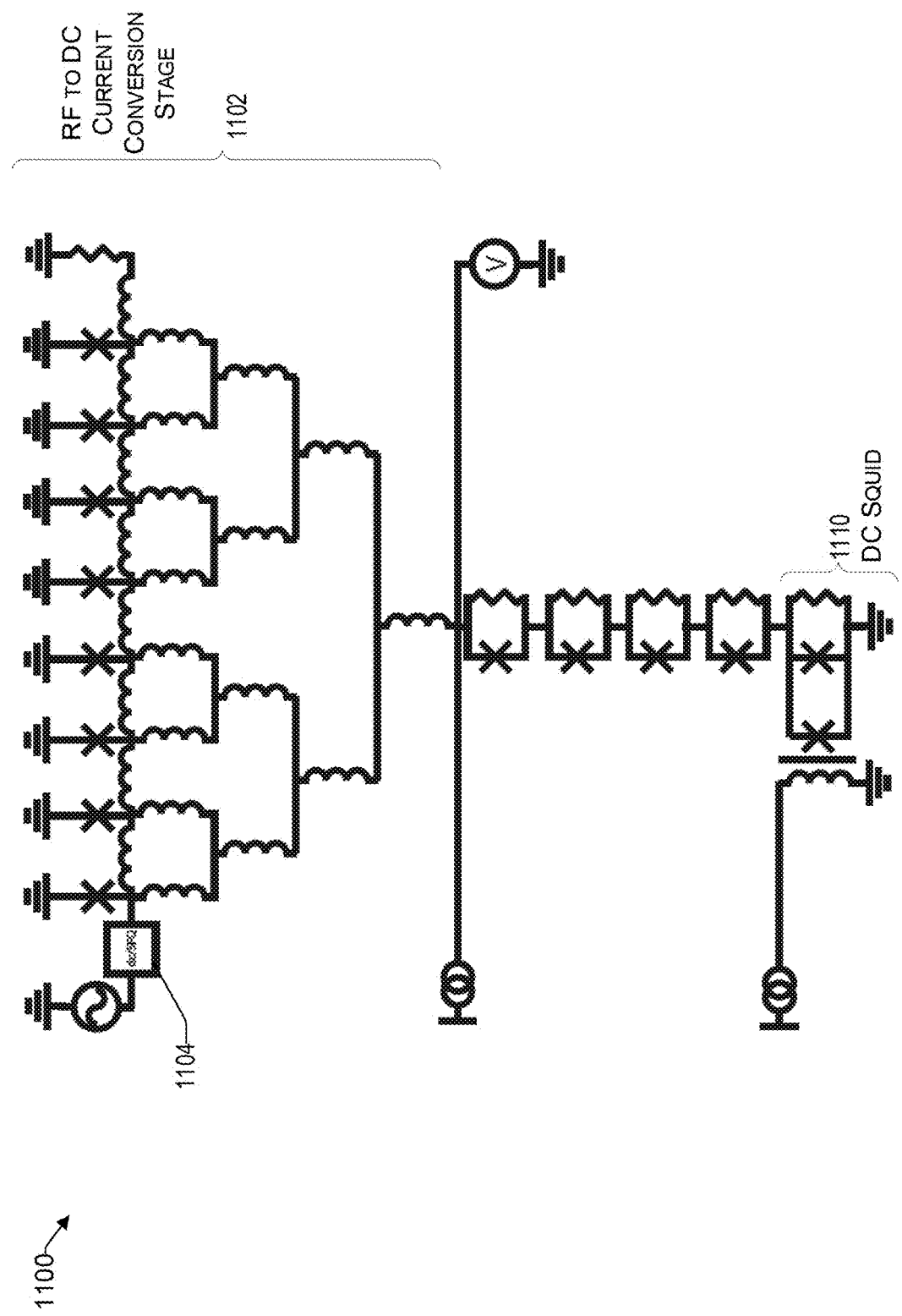
FIG. 11A illustrates an RF to RF converter where the one or more JJs have been replaced with a DC SQUID, consistent with an illustrative embodiment. An RF signal is fed into the dc/SFQ converter 1104, which converts the RF to discrete SFQ pulses. The SFQ pulses are then applied to the RF to DC stage 1102 that, when averaged over time, develops a DC voltage. The DC voltage that develops across this stage drives DC current down the balanced bridge into the stacked JJs (or SQUIDS) until the voltage is balanced between the FJTL and the stack.
Figures 11B, 11C:
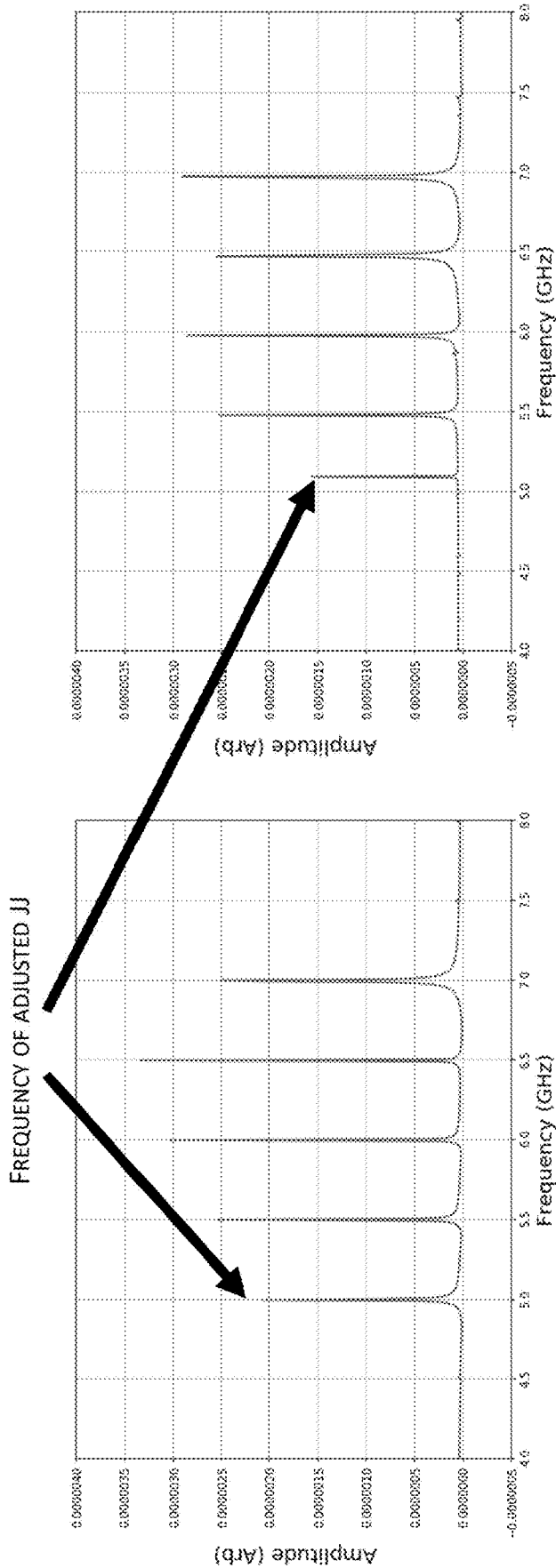
FIGS. 11B and 11C provide plots of the output spectrum from stacked Josephson Junctions, where the shunt resistors have a predetermined delta resistance between each shunt resistor with a constant current for all Josephson Junctions and for different current for the Josephson Junctions, respectively, consistent with illustrative embodiments. The results depicted in FIGS. 11B and 11C are with respect to FIG. 11A, where the Ic of one junction is adjusted in situ via a JJ being replaced by a DC-SQUID and flux biased.

In one embodiment, by adjusting the critical current Ic of the individual junctions in situ (e.g., by replacing one or more JJs with a DC superconducting quantum interference device (SQUID) plus a flux bias line), any spread in the critical currents of the JJs arising from fabrication imperfections can be corrected in situ. In this regard, FIG. 11A illustrates an RF to RF converter 1100 where the one or more JJs have been replaced with a DC SQUID, consistent with an illustrative embodiment. FIGS. 11B and 11C provide plots of the output spectrum from stacked JJs when the shunt resistors having a predetermined delta resistance between each shunt resistor with a constant current for all JJs and for different current for the JJs, respectively, consistent with illustrative embodiments. For example, in FIG. 11B, all five JJs in the stack have the same critical current (i.e., 3 uA for all five JJs). Consequently, the frequency spread can be set solely by the shunt resistors, where Rs=1.0, 1.1, 1.2, 1.3, and 1.4, respectively. By way of contrast, in FIG. 11C a single JJ Ic is modulated to be 33% less than the other four, thereby modulating its characteristic voltage and hence is output frequency (e.g., Ic=2, 3, 3, 3, and 3 uA, respectively).

Figures 12A, 12B:
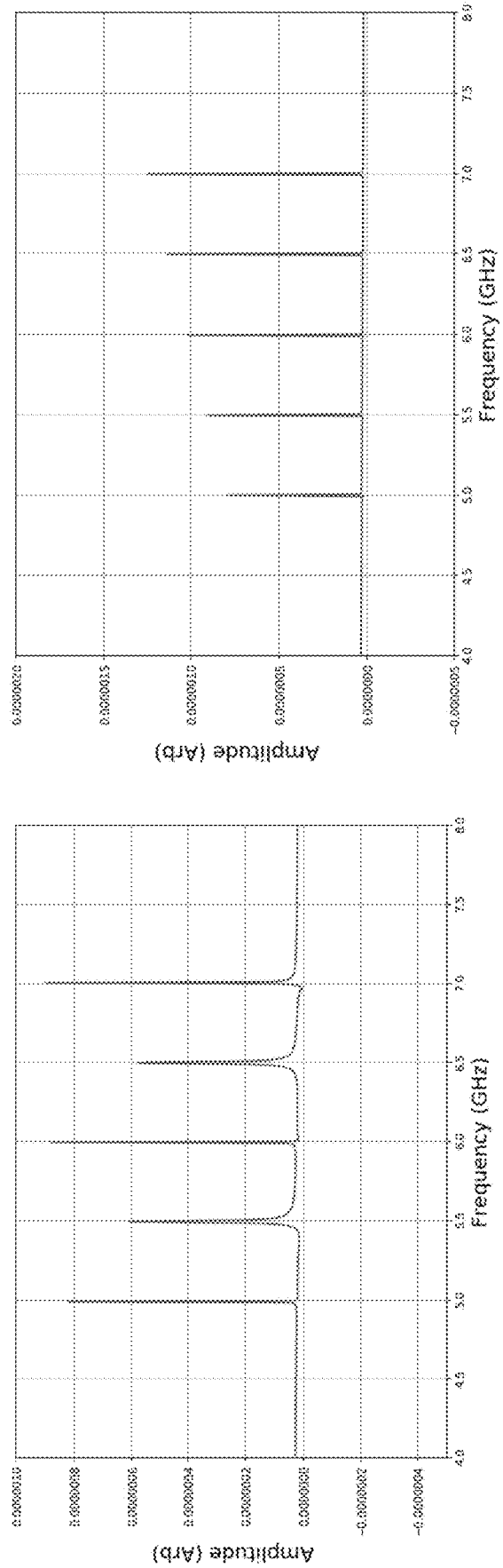
FIG. 12A is a plot of the output spectrum from stacked Josephson Junctions, where the Ic is adjusted while maintaining equal IcR product for each Josephson Junction, consistent with an illustrative embodiment.
FIG. 12B is a plot of the output spectrum of stacked Josephson Junctions, where the Ic is fixed for all five Josephson Junctions while maintaining the IcR product, consistent with an illustrative embodiment.

In one embodiment, if one adjusts the critical currents of the JJs while maintaining the IcR product, one can solely adjust the amplitude of each of the frequency components without adjusting the frequency. In one embodiment, the adjustment of the critical currents can be performed at the design and fabrication stage to maintain IcR. For example, the Ic and R would be adjusted, which may not be done in situ. In this regard, FIG. 12A provides a plot of the output spectrum from stacked JJs where the Ic is adjusted while maintaining equal IcR product for each JJ, consistent with an illustrative embodiment. In one embodiment, this adjustment can be performed during fabrication and not in situ. By way of contrast, FIG. 12B is a plot of the output spectrum of stacked JJs where the Ic is fixed (e.g., 1 uA) for all five JJs, while maintaining the IcR product, consistent with an illustrative embodiment.

It is noted that, in one aspect, a JJ stack with disparate JJ Ic values and/or shunt resistors has the ability to provide frequency division resulting in RF fan out where a single high frequency tone can be divided down into a multitude of tones spanning a bandwidth set by device design. The divided down tones can be set by user choice of shunt resistors.

Figures 13A, 13B:
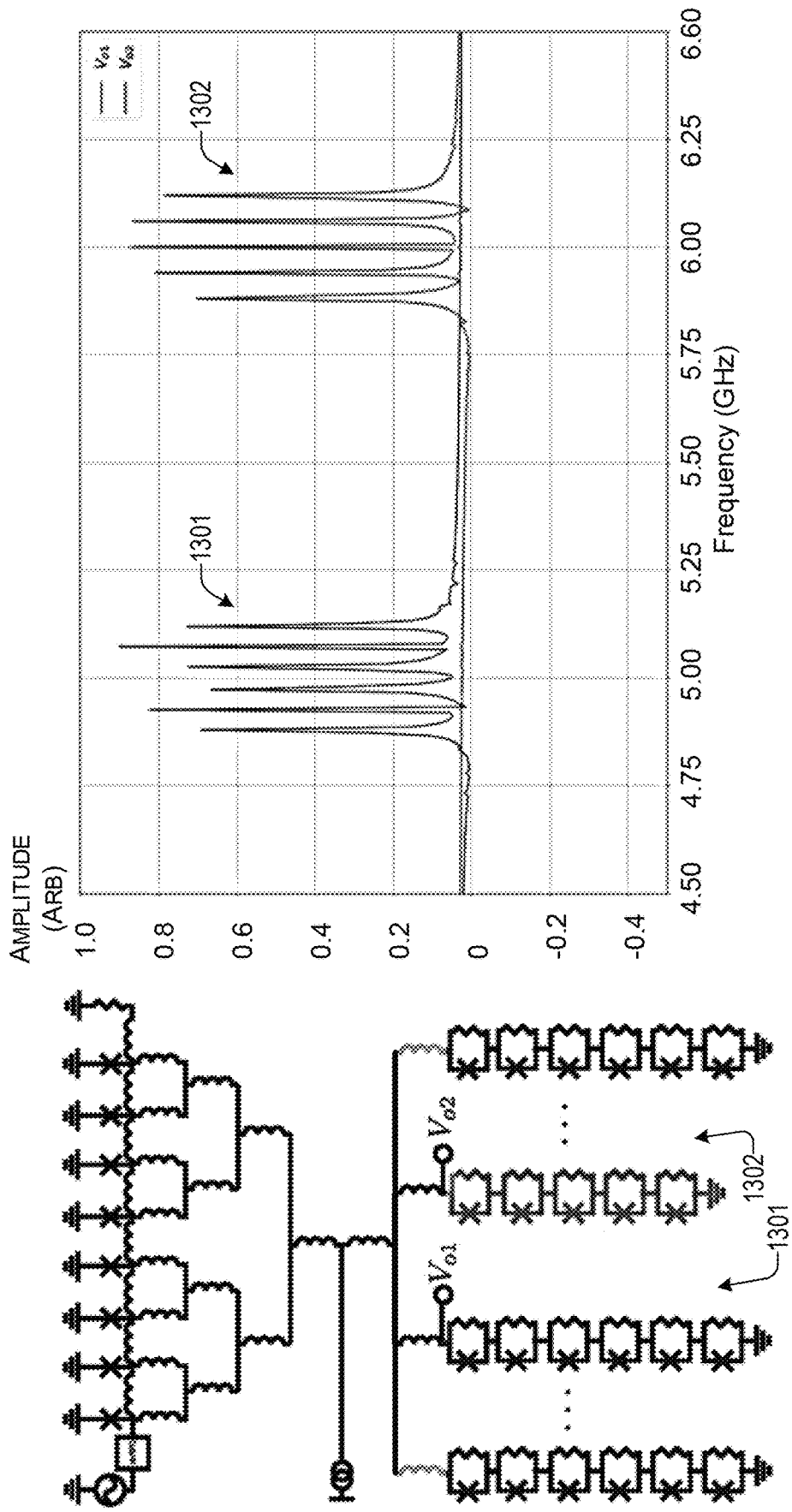
FIG. 13A is an RF to RF converter circuit having additional series stacks of Josephson Junctions in parallel, consistent with an illustrative embodiment.
FIG. 13B provides the frequency response for a first stack and a second stack of FIG. 13A respectively, consistent with an illustrative embodiment.

While an RF to RF converter topology having a single serial stack of five JJs has been illustrated by way of example and to avoid clutter, it will be understood that, in different embodiments, different number of stacked JJs and/or additional series stacked JJs can be implemented in parallel. By way of example, FIG. 13A is a is an RF to RF converter circuit having additional series stacks of JJs in parallel, consistent with an illustrative embodiment. In some embodiments, the number of JJs n may be the same or different in each JJ stack. FIG. 13B provides the frequency response for a first stack and a second stack of FIG. 13A respectively, consistent with an illustrative embodiment. FIG. 13B illustrates that the first stack 1301, having n=6, provides six separate output tones. In contrast, the second stack, having n=5, provides five separate output tones. By replacing one or more of the JJs in one or more of the parallel stacks with an adjustable element such as a DC SQUID, the placement of output tones can be adjusted in situ. The voltage across the bottom junction in each stack will be ground referenced and may therefore be used without level shifting to interface with ground-referenced clock inputs.

The teachings herein can be applied in many areas where controlled clock signals are desired including, without limitation, providing phase coherent clock signals to a multitude of circuits from a single RF drive. In some scenarios, frequency matched phase coherent tones can be provided to a multitude of cryogenic digital to analog converters (DACS) from a single room temperature (RT) RF source. With appropriately controlled fabrication parameter spreads, such devices could provide, from a single RF source, a multitude of qubit drive tones, readout tones, amplifier pump tones, etc. Further, in some embodiments where each JJ in the stack is replaced with a DC SQUID, then the individual frequencies of the divided down signal could be individually controlled via flux pulses to each individual SQUID, thereby modulating its critical current and hence the voltage across its junction. In some embodiments, not all JJs are replaced with a DC SQUID; rather, one or more JJs in each stack are replaced with a DC SQUID, similar to the example of FIG. 11A.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another state (e.g., voltage, current, charge, time, etc.), or converted to another state (e.g., from HIGH to LOW and LOW to HIGH) without materially changing the underlying control method.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A single flux quantum (SFQ) circuit comprising:
a radio frequency (RF) to direct current (DC) conversion stage;
a DC to RF current conversion stage coupled to a single output of the RF to DC conversion stage, wherein the DC to RF current conversion stage comprises a plurality of series stacked Josephson Junctions (JJs) having n stages configured to convert a DC current received from the RF to DC conversion stage and reconvert the DC current to an RF tone.

2. The SFQ circuit of claim 1, wherein the RF to DC conversion stage comprises:
a Feeding Josephson Transmission Line (FJTL); and
a balanced inductive bridge coupled between the FJTL and the DC to RF conversion stage.

3. The SFQ circuit of claim 2, wherein the RF to DC conversion stage further comprises:
an analog RF input current source configured to provide an analog RF input signal; and
a converter module coupled to an output of the RF input current source, configured to convert the analog RF input signal to discrete SFQ pulses.

4. The SFQ circuit of claim 1, wherein each Josephson Junction of the DC to RF current conversion stage includes a corresponding shunt resistor.

5. The SFQ circuit of claim 4, wherein:
each Josephson Junction of the of the DC to RF current conversion stage is configured to have a same value of critical current Ic; and
each resistor of the DC to RF current conversion stage is configured to have a same resistance.

6. The SFQ circuit of claim 5, wherein at least one Josephson Junction of the plurality of series stacked JJs has a critical current Ic that is different from a critical current Ic of the other JJs of the plurality of series stacked JJs.

7. The SFQ circuit of claim 5, wherein each Josephson Junction of the plurality of series stacked JJs has a common critical current Ic.

8. The SFQ circuit of claim 4, wherein at least one shunt resistor of the DC to RF current conversion stage has a nominal resistance that is not equal to those of other shunt resistors of the DC to RF current conversion stage.

9. The SFQ circuit of claim 4, wherein a spacing of a resistance of each shunt resistor is nominally equal.

10. The SFQ circuit of claim 1, further comprising one or more additional plurality of series stacked Josephson Junctions (JJs) configured to convert a DC current received from the RF to DC conversion stage.

11. The SFQ circuit of claim 1, further comprising a second DC to RF current conversion stage coupled in parallel to the DC to RF current conversion stage.

12. A method of frequency conversion, comprising:
receiving an analog radio frequency (RF) input current;
converting the analog RF current into discrete single flux quantum (SFQ) pulses;
providing the SFQ pulses to a feeding Josephson transmission line (JFTL);
developing a voltage across the FJTL that is equal to an RF drive frequency of the received analog RF input current times a superconducting magnetic flux quantum;
driving a resulting current from the FJTL down a balanced inductive bridge;
receiving the resulting current by a series stack of n Josephson Junctions;
generating a voltage across each Josephson Junction based on the resulting current; and
each Josephson Junction providing a separate output tone based on the generated voltage.

13. The method of claim 12, wherein the driving of the resulting current down the balanced inductive bridge is until a point where a voltage across the series stack of Josephson Junctions is equal to a voltage across the FJTL.

14. The method of claim 12, further comprising changing a resistance of a shunt resistor while holding the critical current Ic for each Josephson Junction constant and equal to one another.

15. The method of claim 12, further comprising changing a critical current Ic of at least one of the Josephson Junctions with respect to the other Josephson Junctions of the series stack of n Josephson Junctions.

16. The method of claim 15, wherein the adjustment of the critical current for at least one of the Josephson Junctions is performed during a fabrication of the at least one Josephson Junction.

17. The method of claim 12, wherein at least one shunt resistor is not equal to another shunt resistor of the series stack of n Josephson Junctions.

18. The method of claim 12, further comprising configuring at least one Josephson Junction of the n series stacked Josephson Junctions to have a different critical current Ic.

19. The method of claim 12, further comprising configuring each Josephson Junction of the n series stacked Josephson Junctions to have a common critical current Ic.

20. A single flux quantum (SFQ) circuit comprising:
a radio frequency (RF) to direct current (DC) conversion stage;
a DC to RF current conversion stage coupled to a single output of the RF to DC conversion stage, wherein the DC to RF current conversion stage comprises a plurality of series stacked direct current (DC) superconducting quantum interference (SQUID) units coupled to a flux bias line having n stages, configured to convert a DC current received from the RF to DC conversion stage.

* * * * *